United States Patent [19]
Lee

[11] Patent Number: 5,742,185
[45] Date of Patent: Apr. 21, 1998

[54] DATA BUS DRIVE CIRCUIT FOR SEMICONDUCTOR MEMORY DEVICE

[75] Inventor: Jae Jin Lee, Ichon, Rep. of Korea

[73] Assignee: Hyundai Electronics Industries Co., Ltd., Ichon, Rep. of Korea

[21] Appl. No.: 670,840

[22] Filed: Jun. 28, 1996

[30] Foreign Application Priority Data

Jun. 30, 1995 [KR] Rep. of Korea ............. 95-18876

[51] Int. Cl.$^6$ .................................................. H03K 17/16
[52] U.S. Cl. ........................... 326/86; 326/93; 365/203
[58] Field of Search ................... 365/189.01, 189.08, 365/189.09, 203; 326/82, 83, 86, 87, 93, 95

[56] References Cited

U.S. PATENT DOCUMENTS

| | | | |
|---|---|---|---|
| 4,810,910 | 3/1989 | Schoelikopf et al. | 326/93 X |
| 4,941,128 | 7/1990 | Wada et al. | 365/203 |
| 5,257,226 | 10/1993 | McClure | 365/189.09 |
| 5,267,197 | 11/1993 | McClure | 365/189.01 |
| 5,386,391 | 1/1995 | Watanabe . | |
| 5,450,019 | 9/1995 | McClure et al. | 326/95 X |
| 5,544,105 | 8/1996 | Hirose et al. | 365/203 X |
| 5,661,417 | 8/1997 | Kondoh | 326/86 X |

Primary Examiner—David R. Hudspeth
Attorney, Agent, or Firm—Townsend and Townsend and Crew LLP

[57] ABSTRACT

A data bus drive circuit for a semiconductor memory device, comprising true and complementary data buses for transferring true and complementary data from outside of the semiconductor memory device or from memory cells in the semiconductor memory device, respectively, a first control line for inputting an external read/write control signal, a second control line for inputting an external precharge command signal, a read precharge circuit for switching a voltage from a first voltage source to the true and complementary data buses in response to the read/write control signal from the first control line, a write precharge circuit for switching a voltage from a second voltage source to the true and complementary data buses in response to the read/write control signal from the first control line, and a control circuit for selectively applying the read/write control signal from the first control line to the read and write precharge circuits in response to the precharge command signal from the second control line. According to the present invention, the data bus can be precharged with half a supply voltage after a write operation is performed. Therefore, the data bus drive circuit can enhance the operation speed of the semiconductor memory device and reduce power consumption thereof.

6 Claims, 3 Drawing Sheets

DATA BUS DRIVE CIRCUIT FOR SEMICONDUCTOR MEMORY DEVICE

BACKGROUND OF THE INVENTION

1. Field of the Invention

The present invention relates in general to a data bus drive circuit for a semiconductor memory device, and more particularly to a data bus drive circuit which is capable of precharging a data bus with a half supply voltage (Vcc/2) after a write operation is performed, to enhance the operation speed of a semiconductor memory device and to reduce power consumption thereof.

2. Description of the Prior Art

FIG. 1 is a circuit diagram illustrating the construction of a conventional data bus drive circuit for a semiconductor memory device. As shown in this drawing, the conventional data bus drive circuit comprises a bit line sense amplifier array 50 including a plurality of bit line sense amplifiers 51, 52, . . . , a data bus sense amplifier 30 for sensing and amplifying true and complementary data from the bit line sense amplifier array 50 in a read operation and supplying the sensed and amplified true and complementary data to a data output buffer (not shown), and true and complementary data buses db and dbb for transferring the true and complementary data from the bit line sense amplifier array 50 to the data bus sense amplifier 30, respectively. The conventional data bus drive circuit further comprises a write data driver 40 for transferring a supply voltage Vcc to the true and complementary data buses db and dbb in the read operation and external data to the true and complementary data buses db and dbb in a write operation. The data bus sense amplifier 30, bit line sense amplifiers 51 and 52 and write data driver 40 are well known in the art and thus a detailed description thereof will be omitted.

The conventional data bus drive circuit further comprises a clamp circuit 20 for transferring the supply voltage Vcc to the true and complementary data buses db and dbb in response to an external read/write control signal for selecting the read or write operation, and a precharge circuit 10 for precharging the true and complementary data buses db and dbb with the supply voltage Vcc after the read or write operation of one cycle is performed, to initialize the true and complementary data buses db and dbb.

The clamp circuit 20 includes a control line 13 for inputting the external read/write control signal, a PMOS transistor Q3 connected between a source of the supply voltage Vcc and the true data bus db, and a PMOS transistor Q4 connected between the supply voltage source Vcc and the complementary data bus dbb. The PMOS transistors Q3 and Q4 have their gates for commonly inputting the read/write control signal from the control line 13.

The clamp circuit 20 limits the true and complementary data buses db and dbb to the supply voltage Vcc in the read operation to reduce the range of voltage variations on the true and complementary data buses db and dbb, thereby allowing the read operation to be performed at high speed. Even in the standby state after the read operation is performed, the clamp circuit 20 transfers the supply voltage Vcc to the true and complementary data buses db and dbb to initialize the true and complementary data buses db and dbb at high speed.

The precharge circuit 10 includes a control line 11 for inputting an external control signal, an inverter 12 for inverting the external control signal from the control line 11, a PMOS transistor Q1 connected between the supply voltage source Vcc and the true data bus db, and a PMOS transistor Q2 connected between the supply voltage source Vcc and the complementary data bus dbb. The PMOS transistors Q1 and Q2 have their gates for commonly inputting an output signal from the inverter 12.

The precharge circuit 10 precharges the true and complementary data buses db and dbb with the supply voltage Vcc in response to the control signal of high level from the control line 11 before or after the read or write operation of one cycle is performed. As a result, the precharge circuit 10 enhances the read or write operation speed.

However, the above-mentioned conventional data bus drive circuit has a disadvantage in that power consumption is large. In other words, the data bus is changed to the supply voltage Vcc or the ground voltage Vss in the write operation and, after the write operation is performed, the data bus changed to the ground voltage Vss is precharged with the supply voltage Vcc, resulting in power consumption of Vcc×Cb, where Cb is the charging capacity of the data bus.

Also, the above-mentioned conventional data bus drive circuit has another disadvantage in that the operation speed becomes low when the data bus is changed to the ground voltage Vss in the write operation under the condition that it is precharged with the supply voltage Vcc. Further, the precharge circuit must again precharge the data bus with the supply voltage Vcc after the write operation is performed. As a result, the operation speed is degraded.

SUMMARY OF THE INVENTION

Therefore, the present invention has been made in view of the above problems, and it is an object of the present invention to provide a data bus drive circuit for a semiconductor memory device which is capable of enhancing the operation speed of the semiconductor memory device and reducing power consumption thereof.

In accordance with the present invention, the above and other objects can be accomplished by a provision of a data bus drive circuit for a semiconductor memory device, comprising true and complementary data buses for transferring true and complementary data from the outside of the semiconductor memory device or from memory cells in the semiconductor memory device, respectively; a first control line for inputting an external read/write control signal; a second control line for inputting an external precharge command signal; first switching means for switching a voltage from a first voltage source to the true and complementary data buses in response to the read/write control signal from the first control line; second switching means for switching a voltage from a second voltage source to the true and complementary data buses in response to the read/write control signal from the first control line; and demultiplexing means for selectively applying the read/write control signal from the first control line to the first and second switching means in response to the precharge command signal from the second control line.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
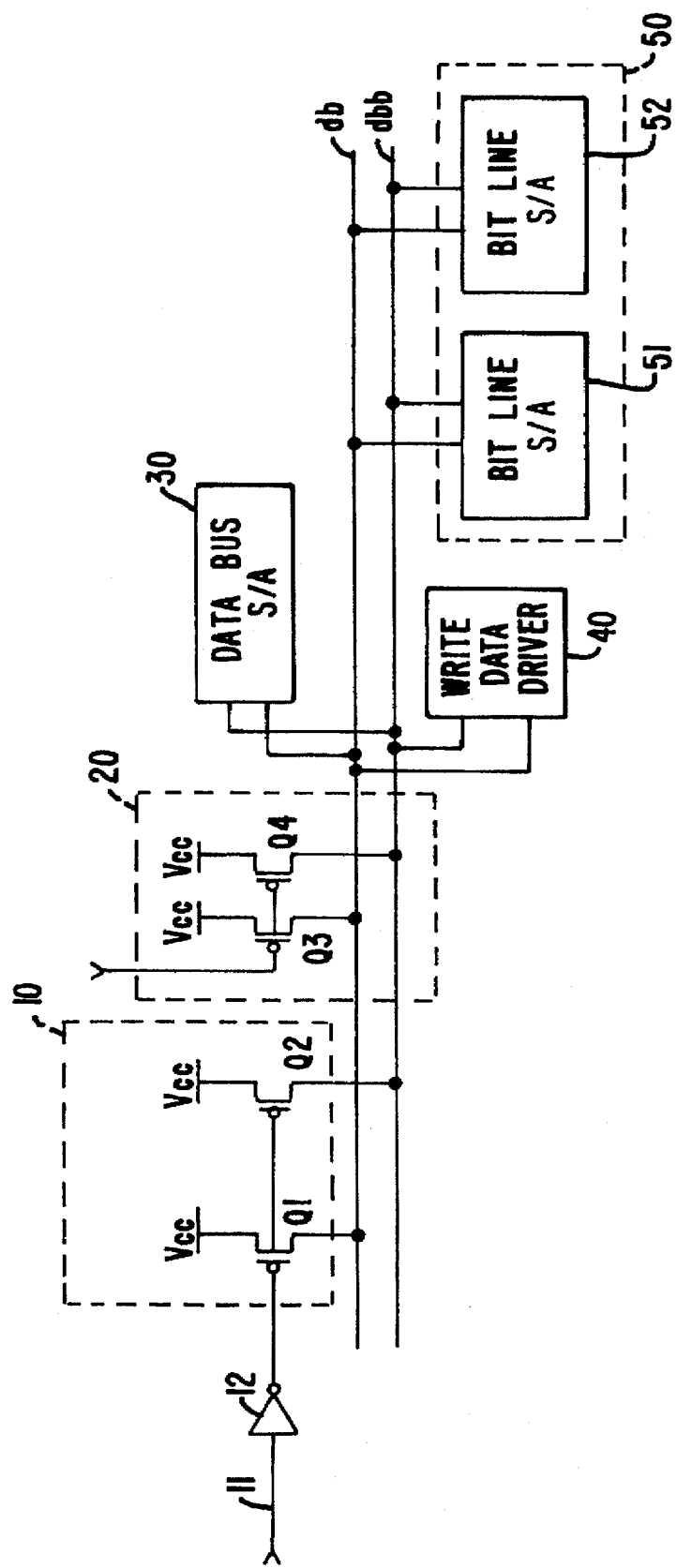
FIG. 1 is a circuit diagram illustrating the construction of a conventional data bus drive circuit for a semiconductor memory device.
Figure 2:
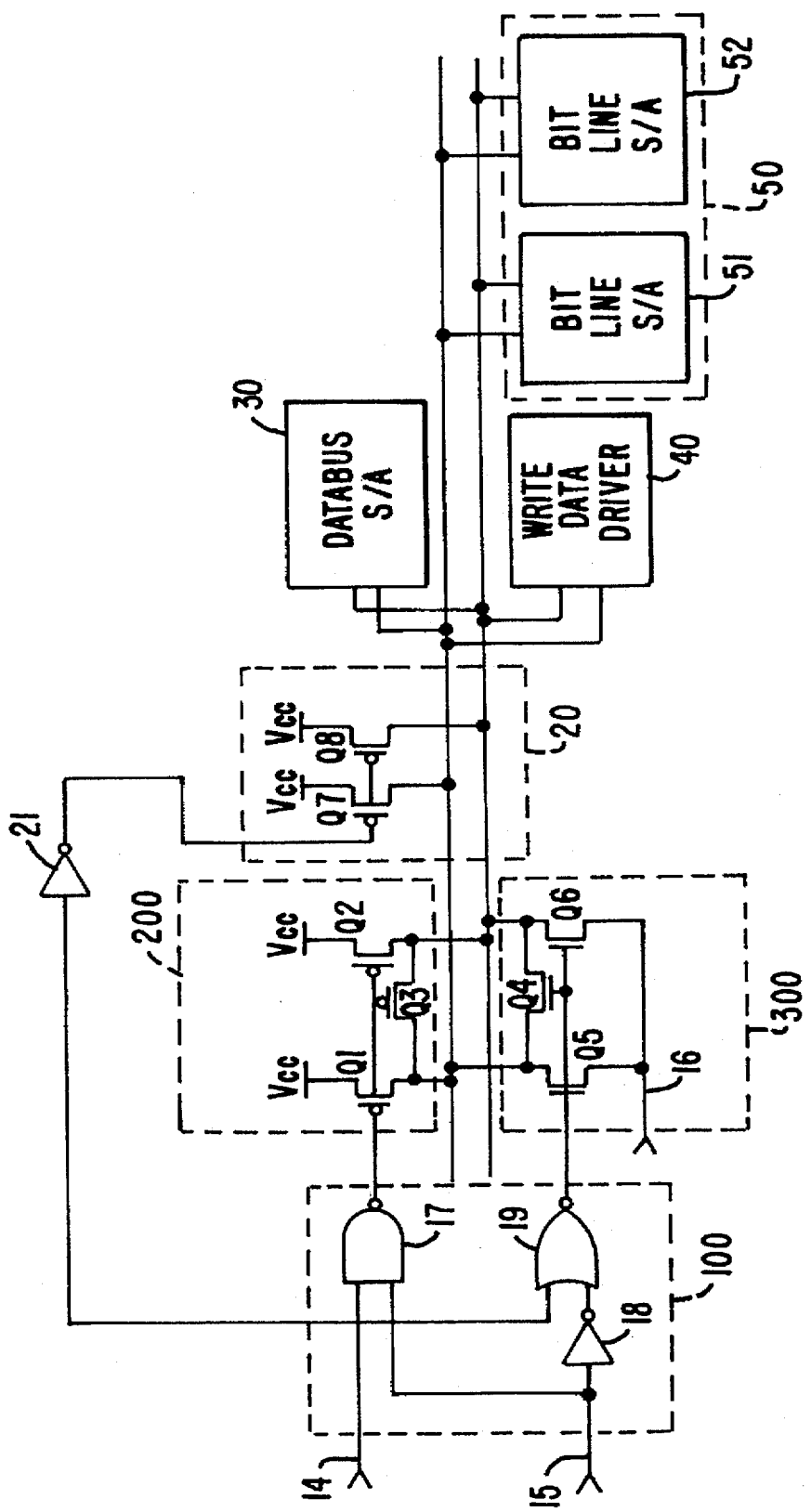
FIG. 2 is a circuit diagram illustrating the construction of a data bus drive circuit for a semiconductor memory device in accordance with an embodiment of the present invention.

FIG. 2 is a circuit diagram illustrating the construction of a data bus drive circuit for a semiconductor memory device in accordance with an embodiment of the present invention. Some parts in this drawing are the same as those in FIG. 1. Therefore, like reference numerals designate like parts.

As shown in FIG. 2, the data bus drive circuit comprises a first control line 14 for inputting an external read/write control signal for selecting a read or write operation, a second control line is for inputting an external precharge command signal, a bit line sense amplifier array 50 including a plurality of bit line sense amplifiers S1, S2, . . . , a data bus sense amplifier 30 for sensing and amplifying true and complementary data from the bit line sense amplifier array 50 in the read operation and supplying the sensed and amplified true and complementary data to a data output buffer (not shown), and true and complementary data buses db and dbb for transferring the true and complementary data from the bit line sense amplifier array 50 to the data bus sense amplifier 30, respectively. The data bus drive circuit further comprises a write data driver 40 for transferring a supply voltage Vcc to the true and complementary data buses db and dbb in the read operation and external data to the true and complementary data buses db and dbb in the write operation, and a clamp circuit 20 for reducing the range of voltage variations on the true and complementary data buses db and dbb in response to the read/write control signal from the first control line 14 to allow the read operation to be performed at high speed.

The data bus sense amplifier 30, bit line sense amplifier array 50 and write data driver 40 are well known in the art and thus, a detailed description thereof will be omitted.

The clamp circuit 20 includes an inverter 21 for inverting the read/write control signal from the first control line 14, a PMOS transistor Q7 connected between a source of the supply voltage Vcc and the true data bus db, and a PMOS transistor Q8 connected between the supply voltage source Vcc and the complementary data bus dbb. The PMOS transistors Q7 and Q8 have their gates for commonly inputting an output signal from the inverter 21.

The clamp circuit 20 is well known in the art and thus, a detailed description thereof will be omitted.

The data bus drive circuit further comprises a read precharge circuit 200 for precharging the true and complementary data buses db and dbb with the supply voltage Vcc after the read operation of one cycle is performed, a write precharge circuit 300 for precharging the true and complementary data buses db and dbb with half the supply voltage (Vcc/2) after the write operation of one cycle is performed, and a control circuit 100 for controlling the read and write precharge circuits 200 and 300 in response to the read/write control signal from the first control line 14 and the precharge command signal from the second control line 15.

The control circuit 100 includes a NAND gate 17 for NANDing the read/write control signal from the first control line 14 and the precharge command signal from the second control line 15, an inverter 18 for inverting the precharge command signal from the second control line 15, and a NOR gate 19 for NORing the read/write control signal from the first control line 14 and an output signal from the inverter 18. The read/write control signal from the first control line 14 is high in level in the read operation and remains at its high level state until the subsequent write signal is inputted. Also, the read/write control signal from the first control line 14 is low in level in the write operation and remains at its low level state until the subsequent read signal is inputted. The precharge command signal from the second control line 15 is applied after the read or write operation is performed.

The read precharge circuit 200 includes a PMOS transistor Q1 connected between the supply voltage source Vcc and the true data bus db, a PMOS transistor Q2 connected between the supply voltage source Vcc and the complementary data bus dbb, a PMOS transistor Q3 connected between the true and complementary data buses db and dbb. The PMOS transistors Q1 and Q2 have their gates for commonly inputting an output signal from the NAND gate 17 in the control circuit 100. Also, the PMOs transistor Q3 has its gate for inputting the output signal from the NAND gate 17 in the control circuit 100.

The write precharge circuit 300 includes an NMOS transistor Q5 connected between a half supply voltage line 16 and the true data bus db, an NMOS transistor Q6 connected between the half supply voltage line 16 and the complementary data bus dbb, and an NMOS transistor Q4 connected between the true and complementary data buses db and dbb. The NMOS transistors Q5 and Q6 have their gates for commonly inputting an output signal from the NOR gate 19 in the control circuit 100. Also, the NMOS transistor Q4 has its gate for inputting the output signal from the NOR gate 19 in the control circuit 100.

The operation of the data bus drive circuit with the above-mentioned construction in accordance with the embodiment of the present invention will hereinafter be described in detail with reference to FIG. 3.

Figure 3:
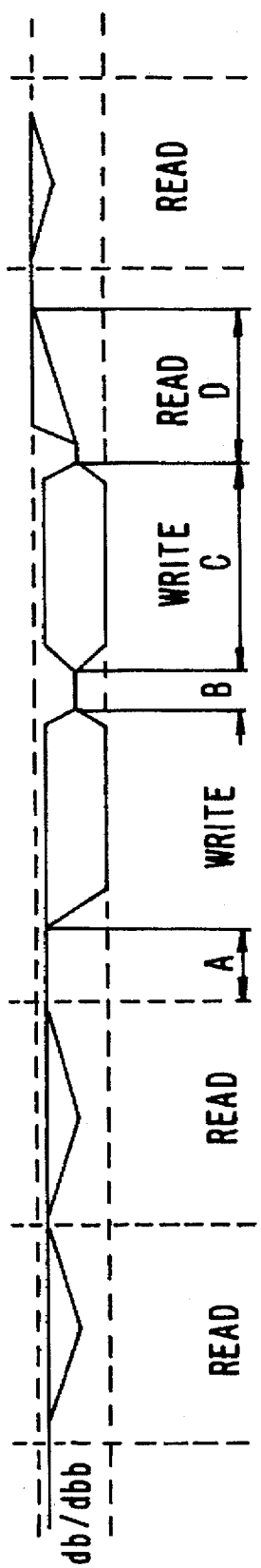
FIG. 3 is a timing diagram illustrating the operation of the data bus drive circuit in accordance with the embodiment of the present invention.

FIG. 3 is a timing diagram illustrating the operation of the data bus drive circuit in accordance with the embodiment of the present invention. First, in the standby state (interval indicated by the reference character A) between the read and write operations, the precharge command signal from the second control line 15 is high in level and the read/write control signal from the first control line 14 remains at its high level state until the subsequent write signal is inputted. As a result, the NAND gate 17 in the control circuit 100 outputs a low level signal to turn on the PMOS transistors Q1-Q3 in the read precharge circuit 200. As the PMOS transistors Q1-Q3 in the read precharge circuit 200 are turned on, the true and complementary data buses db and dbb are precharged with the supply voltage Vcc. Also, the true and complementary data buses db and dbb are clamped at high speed by the clamp circuit 20.

In the standby state (interval indicated by the reference character B) between the write operations, the precharge command signal from the second control line 15 is high in level and the read/write control signal from the first control line 14 and remains at its low level state until the subsequent read signal is inputted. As a result, the NOR gate 19 in the control circuit 100 outputs a high level signal to turn on the NMOS transistors Q4-Q6 in the write precharge circuit 300. As the PMOS transistors Q4-Q6 in the write precharge circuit 300 are turned on, the true and complementary data buses db and dbb are precharged with the half supply voltage Vcc/2.

Then, in the case where the subsequent write operation is performed for an interval C, the true and complementary data buses db and dbb are changed to the supply voltage Vcc or the ground voltage Vss under the condition that they are precharged with the half supply voltage Vcc/2. As a result, the operation speed becomes very high.

Also, in the case where the subsequent read operation is performed for an interval D, the true and complementary data buses db and dbb are changed to the supply voltage Vcc under the condition that they are precharged with the half supply voltage Vcc/2. As a result, the operation speed becomes much higher than that in the case where the true and complementary data buses db and dbb are changed to the supply voltage Vcc under the condition that they are precharged with the ground voltage Vss.

As is apparent from the above description, according to the present invention, the data bus is precharged with the half supply voltage Vcc/2 after the write operation is performed. Therefore, the data bus drive circuit of the present invention has the effect of enhancing the operation speed of the semiconductor memory device and reducing power consumption thereof.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A data bus drive circuit for a semiconductor memory device, comprising:

true and complementary data buses for transferring true and complementary data from the outside of the semiconductor memory device or from memory cells in the semiconductor memory device, respectively;

a first control line for inputting an external read/write control signal;

a second control line for inputting an external precharge command signal;

first switching means for switching a voltage from a first voltage source to said true and complementary data buses in response to the read/write control signal from said first control line;

second switching means for switching a voltage from a second voltage source to said true and complementary data buses in response to the read/write control signal from said first control line; and demultiplexing means for selectively applying the read/write control signal from said first control line to said first and second switching means in response to the precharge command signal from said second control line.

2. A data bus drive circuit for a semiconductor memory device, as set forth in claim 1, wherein the voltage from said first voltage source is a supply voltage or a ground voltage.

3. A data bus drive circuit for a semiconductor memory device, as set forth in claim 2, wherein the voltage from said second voltage source is half the supply voltage.

4. A data bus drive circuit for a semiconductor memory device, as set forth in claim 1, wherein said first switching means includes:

a first PMOS transistor connected between said first voltage source and said true data bus, said first PMOS transistor having its gate for inputting an output signal from said demultiplexing means;

a second PMOS transistor connected between said first voltage source and said complementary data bus, said second PMOS transistor having its gate for inputting the output signal from said demultiplexing means; and a third PMOS transistor connected between said true and complementary data buses, said third PMOS transistor having its gate for inputting the output signal from said demultiplexing means.

5. A data bus drive circuit for a semiconductor memory device, as set forth in claim 1, wherein said second switching means includes:

a first NMOS transistor connected between said second voltage source and said true data bus, said first NMOS transistor having its gate for inputting an output signal from said demultiplexing means;

a second NMOS transistor connected between said second voltage source and said complementary data bus, said second NMOS transistor having its gate for inputting the output signal from said demultiplexing means; and a third NMOS transistor connected between said true and complementary data buses, said third NMOS transistor having its gate for inputting the output signal from said demultiplexing means.

6. A data bus drive circuit for a semiconductor memory device, as set forth in claim 1, wherein said demultiplexing means includes:

a NAND gate for NANDing the read/write control signal from said first control line and the precharge command signal from said second control line and outputting the NANDed result to said first switching means;

an inverter for inverting the precharge command signal from said second control line; and a NOR gate for NORing an output signal from said inverter and the read/write control signal from said first control line and outputting the NORed result to said second switching means.

* * * * *